US010757708B2

(12) United States Patent
Badam et al.

(10) Patent No.: US 10,757,708 B2
(45) Date of Patent: *Aug. 25, 2020

(54) BATTERY-BACKED RAM FOR WEARABLE DEVICES

(71) Applicant: Microsoft Technology Licensing, LLC, Redmond, WA (US)

(72) Inventors: Anirudh Badam, Redmond, WA (US); Ranveer Chandra, Bellevue, WA (US); Edmund Bernard Nightingale, Redmond, WA (US); Jian Huang, Atlanta, GA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 176 days.

This patent is subject to a terminal disclaimer.

(21) Appl. No.: 15/977,673

(22) Filed: May 11, 2018

(65) Prior Publication Data
US 2018/0368131 A1    Dec. 20, 2018

Related U.S. Application Data

(63) Continuation of application No. 14/661,973, filed on Mar. 18, 2015, now Pat. No. 9,986,569.

(51) Int. Cl.
*H04W 72/04* (2009.01)
*G06F 1/30* (2006.01)
(Continued)

(52) U.S. Cl.
CPC ............ *H04W 72/048* (2013.01); *G06F 1/30* (2013.01); *G06F 1/3212* (2013.01);
(Continued)

(58) Field of Classification Search
CPC .... H04B 7/2121; H04B 7/2123; H04B 1/385; H04J 2203/0069; H04Q 2213/394;
(Continued)

(56) References Cited

U.S. PATENT DOCUMENTS

| 6,760,846 B1 * | 7/2004 | Yoshida ................... G06F 1/26 713/300 |
| 2002/0099895 A1 * | 7/2002 | Landron ............... G06F 1/1632 710/303 |

(Continued)

*Primary Examiner* — Robert J Lopata
(74) *Attorney, Agent, or Firm* — Ray Quinney & Nebeker P.C.; James Bullough

(57) ABSTRACT

In embodiments of battery-backed RAM for wearable devices, a mobile device, such as a mobile phone, tablet computer, or other portable device is implemented for wireless connection with a wearable device, such as a smartwatch, exercise tracking device, glasses device, or other wearable device that implements computing technology. The wearable device can store data in battery-backed RAM in the wearable device, and the mobile device can back-up the data with battery-backed RAM in the mobile device when the data is received from the wearable device. A wireless connection can be established for wireless data communication between the wearable device and the mobile device. A data manager can detect a low battery condition of the wearable device, which initiates the data being transferred from the wearable device to the mobile device via the wireless connection.

20 Claims, 5 Drawing Sheets

(51) Int. Cl.
  *G06F 11/14* (2006.01)
  *G06F 1/3212* (2019.01)
  *G06F 1/3234* (2019.01)
  *G06F 3/06* (2006.01)
  *G11C 16/04* (2006.01)
  *H04B 1/3827* (2015.01)
  *H04W 8/24* (2009.01)
  *G06F 11/30* (2006.01)

(52) U.S. Cl.
  CPC .......... *G06F 1/3275* (2013.01); *G06F 3/0619* (2013.01); *G06F 3/0638* (2013.01); *G06F 3/0683* (2013.01); *G06F 11/1441* (2013.01); *G11C 16/04* (2013.01); *H04B 1/385* (2013.01); *H04W 8/24* (2013.01); *G06F 11/3058* (2013.01)

(58) Field of Classification Search
  CPC ..... H04W 72/04; H04W 72/12; H04W 76/00; H04W 8/24
  USPC .......................................................... 370/329
  See application file for complete search history.

(56) References Cited

U.S. PATENT DOCUMENTS

| | | | | |
|---|---|---|---|---|
| 2003/0032449 A1* | 2/2003 | Giobbi | .................. | H04B 1/385 455/556.1 |
| 2003/0233525 A1* | 12/2003 | Reeves | ............... | G06F 11/1441 711/162 |
| 2004/0257463 A1* | 12/2004 | Goris | ..................... | H04N 5/232 348/372 |
| 2005/0114721 A1* | 5/2005 | Azadet | .............. | H04W 52/0277 713/320 |
| 2007/0030156 A1* | 2/2007 | Schlager | .................. | A61N 1/08 340/573.1 |
| 2007/0082655 A1* | 4/2007 | Link, II | .............. | H04L 63/0869 455/410 |
| 2007/0229029 A1* | 10/2007 | Huang | .................. | H02J 7/0047 320/115 |
| 2008/0186793 A1* | 8/2008 | Van Gassel | .......... | G11C 11/406 365/227 |
| 2008/0200220 A1* | 8/2008 | Jackson | ................ | G06F 1/3203 455/574 |
| 2009/0075630 A1* | 3/2009 | McLean | ................ | G06F 21/602 455/411 |
| 2009/0164823 A1* | 6/2009 | Aaltonen | ........... | G01R 31/3648 713/340 |
| 2010/0070475 A1* | 3/2010 | Chen | .................... | G06F 11/1451 707/640 |
| 2010/0080057 A1* | 4/2010 | Reuter | .................... | G11C 5/141 365/185.04 |
| 2010/0255876 A1* | 10/2010 | Jordan | .................. | A61B 5/0002 455/556.1 |
| 2011/0203347 A1* | 8/2011 | Hower | ................... | G01D 21/00 73/12.01 |
| 2012/0311237 A1* | 12/2012 | Park | ..................... | G06F 12/0246 711/103 |
| 2013/0097458 A1* | 4/2013 | Sekino | ................ | G06F 11/1441 714/6.3 |
| 2013/0111202 A1* | 5/2013 | Zeng | ..................... | G06F 9/4401 713/2 |
| 2013/0116860 A1* | 5/2013 | Kawai | ..................... | B60R 25/24 701/2 |
| 2013/0132347 A1* | 5/2013 | Chen | .................... | G06F 11/1456 707/648 |
| 2013/0281816 A1* | 10/2013 | Strauss | ................ | A61B 5/0006 600/391 |
| 2014/0117921 A1* | 5/2014 | Suomela | ............. | H04B 5/0031 320/103 |
| 2014/0162768 A1* | 6/2014 | Nelson | ................ | G07F 17/3251 463/25 |
| 2014/0189389 A1* | 7/2014 | Lynar | ..................... | G06F 1/329 713/320 |
| 2014/0273858 A1* | 9/2014 | Panther | ................ | A61B 5/0002 455/41.2 |
| 2014/0300490 A1* | 10/2014 | Kotz | ..................... | A61B 5/0028 340/870.3 |
| 2015/0227127 A1* | 8/2015 | Miller | .................. | G05B 19/042 700/244 |
| 2015/0301574 A1* | 10/2015 | Kim | ........................ | G06F 1/163 345/156 |
| 2015/0334536 A1* | 11/2015 | Suzuki | .................. | H04W 48/14 370/329 |
| 2016/0003915 A1* | 1/2016 | Kamei | ............... | G01R 31/3835 324/434 |
| 2016/0072941 A1* | 3/2016 | Takagi | ............... | H04M 1/72527 455/557 |
| 2016/0133121 A1* | 5/2016 | Rajala | .................... | G08B 21/22 340/506 |
| 2016/0266979 A1* | 9/2016 | Glover | ............... | G06F 9/30083 |
| 2016/0294424 A1* | 10/2016 | Adams, III | ........... | H04W 48/18 |
| 2018/0024768 A1* | 1/2018 | Nguyen | ................ | G06F 12/16 711/103 |

* cited by examiner

BATTERY-BACKED RAM FOR WEARABLE DEVICES

RELATED APPLICATION

This application is a continuation of and claims priority to U.S. patent application Ser. No. 14/661,973, filed Mar. 18, 2015, entitled "Battery-Backed RAM for Wearable Devices", the disclosure of which is hereby incorporated by reference herein in its entirety.

BACKGROUND

Wearable devices, such as a smartwatch, an exercise tracking device, a glasses device, or other wearable device that implements computing technology (also referred to as "wearables") are increasingly being developed and used by consumers. The size and weight constraints associated with wearable devices due to aesthetics and consumer appeal limit their battery capacity and can restrict some functionality of wearable applications on the devices. The need for durable data storage further compounds this problem as flash storage on wearable devices typically slows down the applications and causes them to consume more battery power.

The power capacity and lifetime of a battery is primarily a function of the battery size; smaller devices have smaller batteries with less available power. Further, these wearable devices generate sensor data, such as body sensor readings and location information, which must be secure from loss and theft. However, data encryption is also energy-intensive, and the sensitive nature of personal information that wearable devices collect dictates using appropriate protection mechanisms with a durable medium like flash memory that can be easily detached from a stolen device to retrieve personal data of the user of the stolen device.

SUMMARY

This Summary introduces features and concepts of battery-backed RAM for wearable devices, which is further described below in the Detailed Description and/or shown in the Figures. This Summary should not be considered to describe essential features of the claimed subject matter, nor used to determine or limit the scope of the claimed subject matter.

Embodiments of battery-backed RAM for wearable devices is described. In the embodiments, a mobile device, such as a mobile phone, tablet computer, or other portable device is implemented for wireless connection with a wearable device, such as a smartwatch, exercise tracking device, glasses device, or other wearable device that implements computing technology. The wearable device can store data using battery-backed RAM in the wearable device, and the mobile device can back-up the data with battery-backed RAM in the mobile device when the data is received from the wearable device. In alternate implementations, non-volatile memory (NVM) technologies, such as spin-transfer torque (STT) RAM or phase-change memory (PCM), may be utilized in place of, or in addition to, the battery-backed RAM. A wireless connection can be established for wireless data communication between the wearable device and the mobile device.

A data manager can detect a low battery condition of the wearable device, which initiates the data being transferred from the wearable device to the mobile device via the wireless connection. Alternatively or in addition, the data manager can detect a quantity threshold of the data maintained with the battery-backed RAM in the wearable device, determine the battery power of the wearable device, and initiate a transfer of the data that is ready to be transferred to the mobile device based on the quantity level of the data and having the battery power to facilitate the data transfer. The mobile device backs-up the wearable device data to the battery-backed RAM in the mobile device when the data is received from the wearable device, and when detecting a low battery condition of the mobile device, further backs-up the data from the battery-backed RAM in the mobile device to flash memory in the mobile device.

In implementations, the data manager is instantiated on both the wearable device and the mobile device, and the wearable device data manager communicates with the mobile device data manager via the wireless connection. The data manager can determine a wireless communication system over which the wireless connection is established, where the wireless communication system is determined based on battery power that will be utilized by the wireless communication system to transfer the wearable device data to the mobile device. The data manager can also determine the wireless communication system based on an estimate of the battery power that will be utilized to transfer the data, where the estimate is determined using the wireless communication system over which the wireless connection is established, or a different wireless communication system than the wireless communication system over which the wireless connection is established.

BRIEF DESCRIPTION OF THE DRAWINGS

Embodiments of battery-backed RAM for wearable devices are described with reference to the following Figures. The same numbers may be used throughout to reference like features and components that are shown in the Figures.

DETAILED DESCRIPTION

Figure 1:
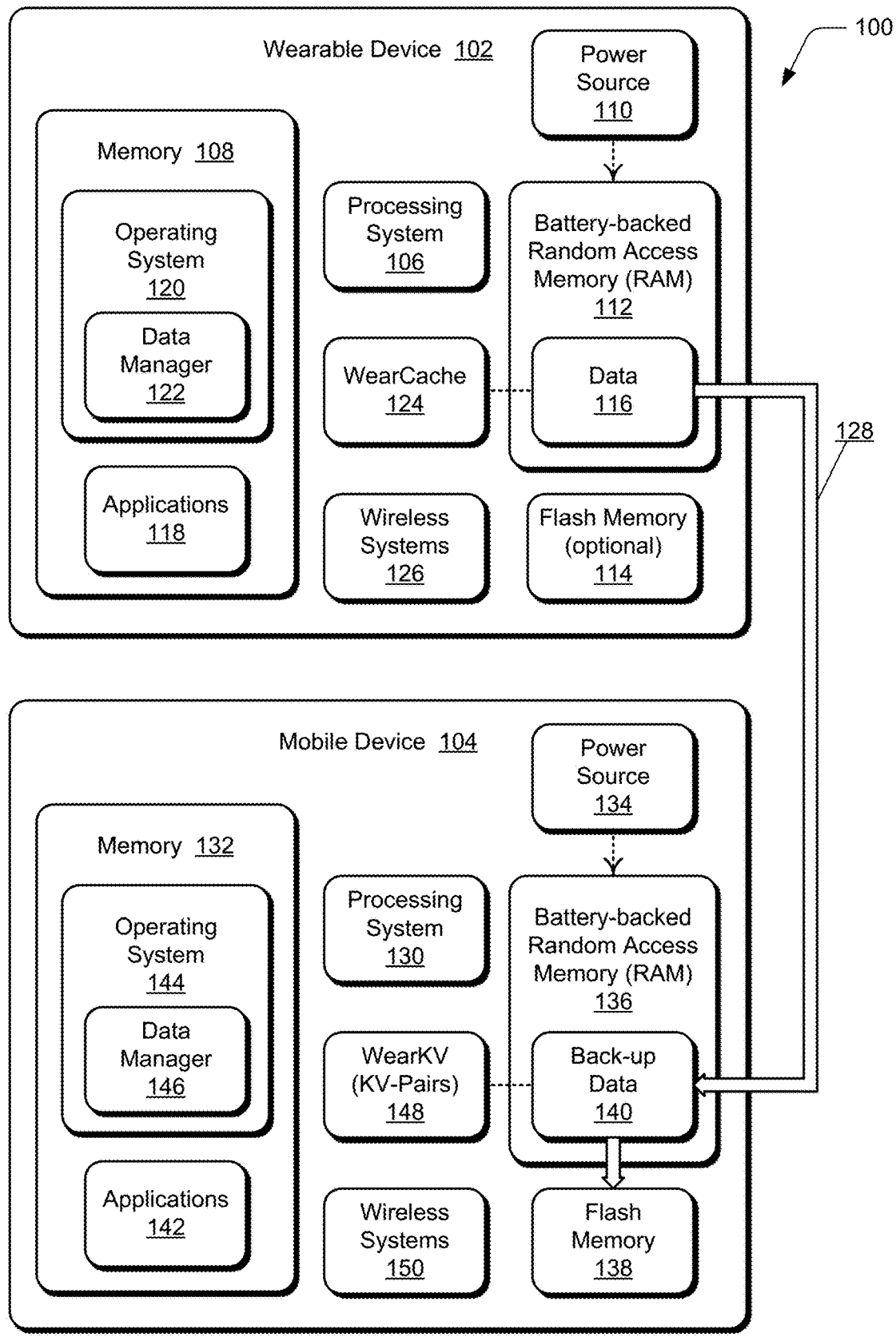
FIG. 1 illustrates an example system in which embodiments of battery-backed RAM for wearable devices can be implemented.

Embodiments of battery-backed RAM for wearable devices are described and can be implemented to provide a data back-up of wearable device data to a mobile device that is communicatively-linked to a wearable device. For example, a mobile device, such as a mobile phone, tablet computer, or other portable device can establish a wireless connection with a wearable device, such as a smartwatch, exercise tracking device, glasses device, or other wearable device that implements computing technology. The wearable device can maintain data with battery-backed RAM in the wearable device, and the mobile device can back-up the data with battery-backed RAM in the mobile device when the data is received from the wearable device. Wearable devices typically have limited battery capacities (e.g., only one to two Watt-hours), whereas modern mobile devices, such as a mobile phone, have greater battery capacities (e.g., seven to ten Watt-hours) and can be utilized as a data backup, particularly for low battery conditions of the wearable devices. In implementations, a low-battery condition of a wearable device is detected and the wearable device data that is maintained in battery-backed RAM is flushed (e.g., transferred) to the memory of a mobile device (e.g., a mobile phone) that has a wireless connection with the wearable device.

Features of battery-backed RAM for wearable devices leverage the low-power network connectivity systems that are available on wearable devices to utilize the extended battery and data storage capabilities of a mobile device (e.g., a mobile phone). New data that is generated on a wearable device can be asynchronously transmitted to a mobile device, which then performs the energy-intensive operations of storing the data with encryption in local flash memory on the mobile device. In implementations, pages or regions of dynamic RAM (DRAM) that are battery-backed are differentiated, such as with a page table in a known physical memory region that is used to identify the pages or regions of the battery-backed RAM from the pages or regions that are used as traditional volatile memory pages by the device operating system and/or other applications. This provides a mechanism to flush the non-volatile parts of DRAM to flash memory in the event of a system crash, thereby protecting the data in the battery-backed RAM. Accordingly, this provides a fast and durable storage solution that facilitates conserving the battery power of the wearable device, yet maintains the interactivity of wearable device applications with the mobile device. This can also reduce the need for a large battery in a wearable device, and may eliminate the need to implement flash memory or other storage mediums in addition to the DRAM in the wearable devices.

While features and concepts of battery-backed RAM for wearable devices can be implemented in any number of different devices, systems, networks, environments, and/or configurations, embodiments of battery-backed RAM for wearable devices are described in the context of the following example devices, systems, and methods.

FIG. 1 illustrates an example system 100 in which embodiments of battery-backed RAM for wearable devices can be implemented. The example system 100 includes a wearable device 102, such as a smartwatch, exercise tracking device, glasses device, or other wearable device that implements computing technology. The example system also includes a mobile device 104, such as a mobile phone, tablet computer, or other portable device that can be implemented for a wireless connection with the wearable device. Both the wearable device 102 and the mobile device 104 can be implemented with various computing technology components, and with any number and combination of different components as further described with reference to the example device shown in FIG. 5.

The wearable device 102 is implemented with a processing system 106 and memory 108 (e.g., non-volatile, physical memory), as well as with a power source 110 (e.g., a battery) to power the device components. In this example, the wearable device 102 also includes battery-backed random access memory (RAM) 112 and may optionally include flash memory 114. The power source 110 provides power for the battery-backed RAM 112 to maintain wearable device data 116, such as sensor data from wearable device sensors and/or data that may be generated by device applications 118. In alternate implementations, non-volatile memory (NVM) technologies, such as spin-transfer torque (STT) RAM or phase-change memory (PCM), may be utilized in place of, or in addition to, the battery-backed RAM. The memory 108 maintains software applications, such as the device applications 118 and an operating system 120 of the wearable device.

The wearable device 102 includes a data manager 122, also referred to herein as the "weardrive" in conjunction with a data manager that is implemented by the mobile device 104. The data manager 122 can be implemented as a software application or module, such as executable software instructions (e.g., computer-executable instructions) that are executable with the processing system 106 of the wearable device to implement embodiments of battery-backed RAM for wearable devices. The data manager 122 can be stored on computer-readable storage memory (e.g., the memory 108), such as any suitable memory device or electronic data storage implemented by the wearable device. In implementations, the data manager 122 is instantiated as a runtime program, or is implemented as a component of the device operating system 120 or the storage system, and manages the device data 116 and a wearcache 124.

The wearcache 124 is an instance of a key-value (KV) store on the wearable device 102, and has a key-value store interface that is conventional for mobile applications (e.g., the device applications 118). The device data 116 data is maintained as key-value pairs, and the wearcache 124 includes an index of the key-value pairs that is generated to identify regions of the battery-backed RAM 112 to recover a state of the battery-backed RAM 112 after the wearable device 102 crashes or loses power. Features and aspects of the data manager 122 (i.e., the weardrive) and the wearcache 124 are further described below in embodiments of battery-backed RAM 112 for wearable devices.

The wearable device 102 is a wireless communication-enabled device with one or more wireless systems 126 implemented to support several radio access technologies, which may include Bluetooth™ Low Energy (BLE 4.1, also referred to as Bluetooth™ Smart) and WiFi, as well as 802.11a/b/g/n/ac network connectivity technologies. For example, the wireless systems 126 can be implemented as multiple, different wireless radio systems, such as a Wi-Fi radio system that includes a radio device, antenna, and chipset implemented for Wi-Fi wireless communications technology. Generally, when activated or turned-on, a wireless radio system scans for an endpoint connection to establish a wireless communication link. For example, the wearable device 102 includes a BLE radio system that scans for another BLE-enabled device within communication range and establishes a wireless connection 128 (e.g., the mobile device 104) for wireless communication via Bluetooth™ Low Energy.

Similar to the wearable device 102, the mobile device 104 is implemented with a processing system 130 and memory 132 (e.g., physical memory), as well as with a power source 134 (e.g., a battery) to power the device components. In this example, the mobile device 104 also includes battery-backed random access memory (RAM) 136 and includes flash memory 138. The power source 134 provides power for the battery-backed RAM 136 to maintain back-up data 140, such as the wearable device data 116 that is received from the wearable device 102 for back-up. The memory 132 maintains software applications, such as device applications 142 and an operating system 144 of the mobile device.

The mobile device 104 also includes a data manager 146, and as noted above, the data manager 146 is also referred to as the "weardrive" in conjunction with the data manager 122 that is implemented by the wearable device 102. The data manager 146 can be implemented as a software application or module, such as executable software instructions (e.g., computer-executable instructions) that are executable with the processing system 130 of the mobile device to implement embodiments of battery-backed RAM for wearable devices.

The data manager 146 can be stored on computer-readable storage memory (e.g., the memory 132), such as any suitable memory device or electronic data storage implemented by the mobile device 104. In implementations, the data manager 146 is instantiated as a runtime program, or is implemented as a component of the device operating system 144 or the storage system, and manages the back-up data 140 and a wearKV 148 (wear key-value store). In implementations, the mobile device data manager 146 and the wearable device data manager 122 are instantiated as runtime programs on the respective devices for communication between the devices via the wireless connection 128.

Similar to the wearcache 124 on the wearable device 102, the wearKV 148 is an instance of the key-value (KV) store on the mobile device 104, and has the key-value store interface that is conventional for mobile applications (e.g., the device applications 142). In implementations, the back-up data 140 (e.g., the back-up of the wearable device data 116) is maintained in a storage format, such as in a database, in a file system, as key-value pairs, in block stores, and the like. The wearKV 148 includes an index of the data in the storage format, such as key-value pairs, and the index is generated to identify regions of the battery-backed RAM 136 to recover a state of the battery-backed RAM 136 after a device crash or loss of power. Features and aspects of the data manager 146 (i.e., the weardrive) and the wearKV 148 are further described below in embodiments of battery-backed RAM for wearable devices.

The mobile device 104 is a wireless communication-enabled device with one or more wireless systems 150 implemented to support several radio access technologies, which may include Bluetooth™, Bluetooth™ Low Energy (BLE 4.1, also referred to as Bluetooth™ Smart), and WiFi, as well as 802.11a/b/g/n/ac network connectivity technologies and 3G, 4G, and/or LTE cellular communication technologies. For example, the wireless systems 150 can be implemented as multiple, different wireless radio systems, such as a Wi-Fi radio system that includes a radio device, antenna, and chipset implemented for Wi-Fi wireless communications technology.

The battery-backed RAM 112 in the wearable device 102 is an example of dynamic RAM (DRAM) that is continuously refreshed by a battery (e.g., the power source 110). Typically, the battery is not removable from a wearable device, thus the DRAM can be considered as non-volatile, and in this example, as the battery-backed RAM 112. Similarly, the battery-backed RAM 136 in the mobile device 104 is another example of dynamic RAM (DRAM) that is continuously refreshed by a battery (e.g., the power source 134). Typically, the only time that the battery does not refresh the DRAM is when the device is shutdown, the battery runs out of energy, or when the battery is removed from the mobile device 104. In the first two instances, an early shutdown warning is generated allowing data in the battery-backed RAM 136 to be flushed to the flash memory 138 just in time before the refresh stops.

In the wearable device 102 and/or the mobile device 104, the battery-backed RAM coexists with DRAM to minimize operating system changes. The battery-backed RAM expands and contracts dynamically according to the memory pressure for the rest of the operating system. Generally, wearable devices have very little available DRAM, such as less than 0.5 GB of DRAM. While reserving a known and fixed region of physical memory as battery-backed RAM simplifies the implementation, it leads to fragmentation of the DRAM and does not allow battery-backed RAM to dynamically expand and contract in accordance with application and operating system requirements. However, implementations of battery-backed RAM for wearable devices adapts to the memory pressure and spans across non-contiguous physical memory pages.

In implementations, the data managers of the respective devices (i.e., the wearable device data manager 122 and the mobile device data manager 146)—collectively referred to as the weardrive—coordinate use of the battery-backed RAM 112 in the wearable device 102 and the battery-backed RAM 136 in the mobile device 104. The wearable device 102 effectively utilizes the mobile device 104 as secondary storage for the wearable device data 116, and the mobile device 104 utilizes the flash memory 138 as secondary storage for the data maintained in the battery-backed RAM 136 on the mobile device 104.

The data 140 that is maintained in the battery-backed RAM 136 of the mobile device 104 is not lost even after an operating system crash because the weardrive (e.g., the data managers) back-up the data 140 that is maintained in the battery-backed RAM 136 to the flash memory 138 in the event of an operating system crash. Regions of the physical memory that are used as the battery-backed RAM 136 are identified, and the weardrive reserves a small known region of the physical memory 132 to store one bit per physical page in DRAM to represent whether the physical page belongs to the battery-backed RAM 136. Device firmware can use the stored bits to identify the battery-backed RAM 136 pages after an operating system crash (and before shutdown), and writes them to a reserved region in the flash memory 138. This simple design allows the battery-backed RAM 136 to coexist with DRAM and also enables a firmware without any operating system state awareness to provide for data durability.

The weardrive (e.g., the data managers) utilize the battery-backed RAM in the wearable device 102 and/or the mobile device 104 as long as there is enough battery life left to ensure durability of the data in the event of a system crash. For example, when the battery level reduces to a low threshold level (e.g., approximately 7% in implementation), the weardrive stops using the battery-backed RAM and operates as if all of the DRAM is volatile memory, and the data is written to flash memory for back-up. The approximate 7% low threshold battery level is based on the observation that flushing 512 MB of data from the battery-backed RAM to the flash memory sequentially uses approximately 5% of the wearable device battery life (however, the low threshold battery level can be adapted according to different hardware implementations).

In implementations, the weardrive is optimized for warm resets of the operating system. For example, if the available battery power (e.g., energy level) is above 7%, the firmware does not flush the data in the battery-backed RAM to flash memory, but rather continues to refresh the battery-backed RAM without scrubbing or cleaning any data. The operating system can then separate the memory pages in the battery-backed RAM from regular DRAM using the page table and continue the boot process.

In the event of an operating system deadlock, there is a chance that the data maintained in the battery-backed RAM will be permanently lost, such as if the mobile device 104 is completely drained of battery power. The weardrive implements a handshake process to detect if the operating system has hung. When the low battery threshold reaches 7%, the firmware schedules a BIOS-context process that wakes up once every sixty seconds and sets a bit in a known portion of memory that it expects the operating system to reset every sixty seconds. If the operating system fails to reset the bit during an iteration, then the firmware assumes that the operating system has hung and flushes the data to the flash memory 138 independently before disabling the handshake process. The handshake process is also disabled as soon as the operating system starts treating DRAM as volatile memory.

In embodiments of battery-backed RAM for wearable devices, the weardrive (i.e., the wearable device data manager 122 and the mobile device data manager 146) implements a distributed storage system spanning across the devices, such as for extended display and sensor data analysis scenarios that span data across the wearable device 102 and the mobile device 104. In many extended-display scenarios, the wearable device 102 is utilized as an extension of a full application 142 on the mobile device 104, generally due to the smaller screen sizes on wearable devices 102 (e.g., a smartwatch and exercise tracking device), the lack of a touch-screen, and the smaller battery size. Generally, the weardrive can manage the wearable device 102 as a cache and the mobile device 104 as a server, where the wearable device 102 includes the wearcache 124 and the mobile device includes the wearKV 148 as the main storage of data. The wearcache 124 and the wearKV 148 both have a key-value store interface that is conventional for mobile applications, and the same KV-store system is used to implement both the wearcache and wearKV.

The wireless systems of the respective devices (i.e., the wearable device wireless systems 126 and the mobile device wireless systems 150) enable the wearable device 102 to maintain a constant wireless connection 128 with the mobile device 104 at a low-energy, such as with Bluetooth™ Low Energy (BLE). However, the low modulation rate of BLE does not facilitate large data transfers without using a lot of battery power. WiFi-Direct (WFD) on the other hand requires higher constant power to maintain a connection, but supports low-energy large data transfers due to high modulation rates. Accordingly, BLE and WFD can be utilized together for low-energy data sharing between the wearable device 102 and the mobile device 104. The BLE wireless technology can be used to maintain a constant connection between the devices and for short data transfers, and the WFD wireless technology can be turned-on for the larger data transfers.

In implementations, the data managers (i.e., the wearable device data manager 122 and the mobile device data manager 146) of the respective devices can communicate to determine and initiate the wireless systems 126 and 150 over which the wireless connection 128 is established. The wireless connection 128 established may be determined based on an estimate of the battery power that will be utilized to transfer the wearable device data 116, where the estimate of the battery power is determined using either the wireless communication system over which the wireless connection is established or a different wireless system. For example, Bluetooth™ signals can be used to estimate energy consumption if WFD is utilized to transfer the wearable device data 116 from the wearable device 102 for back-up at the mobile device 104. The data managers can exchange control signals via BLE to initiate turning-on WFD, and data transmission can begin on BLE and then switch over to WFD when it is available.

The data managers are implemented to estimate the right data transfer size for turning-on WFD by initiating data transfers of various sizes on BLE and WFD, while keeping the BLE always on. The data transfers with various sizes are communicated between the wearable device 102 and the mobile device 104, and the power consumption for each data transfer is monitored. The data managers can then estimate the energy (e.g., battery power) needed to transfer the wearable device data 116 from the wearable device 102 to the mobile device 104 via WFD. The energy estimates for WFD include the energy needed to turn the WiFi chipset on and off. The determined point for switching to WFD depends on signal quality, and a crossover-point database for various modulation rates of BLE and WFD can be generated. The BLE signal strength is used to estimate the WiFi signal strength, as BLE and WiFi use the same band and radio over the same distance. The WFD wireless technology can be turned-on if the data transfer size is larger than the determined crossover size.

Determining when to turn off WFD also conserves battery power because WFD consumes more power than BLE in an idle state (i.e., in a standby power gap). However, discovery, connection, and powering-down are power-intensive and frequently turning WFD on and off can incur more energy usage than just maintaining an idle state for data transfers with small inter-arrival times. Two mechanisms can be utilized, the first being a running average of inter-arrival times and predicting on the basis of the average-value if the WFD should be kept turned-on, and the second being to explicitly facilitate applications that can tolerate delay to batch data.

Figure 2:
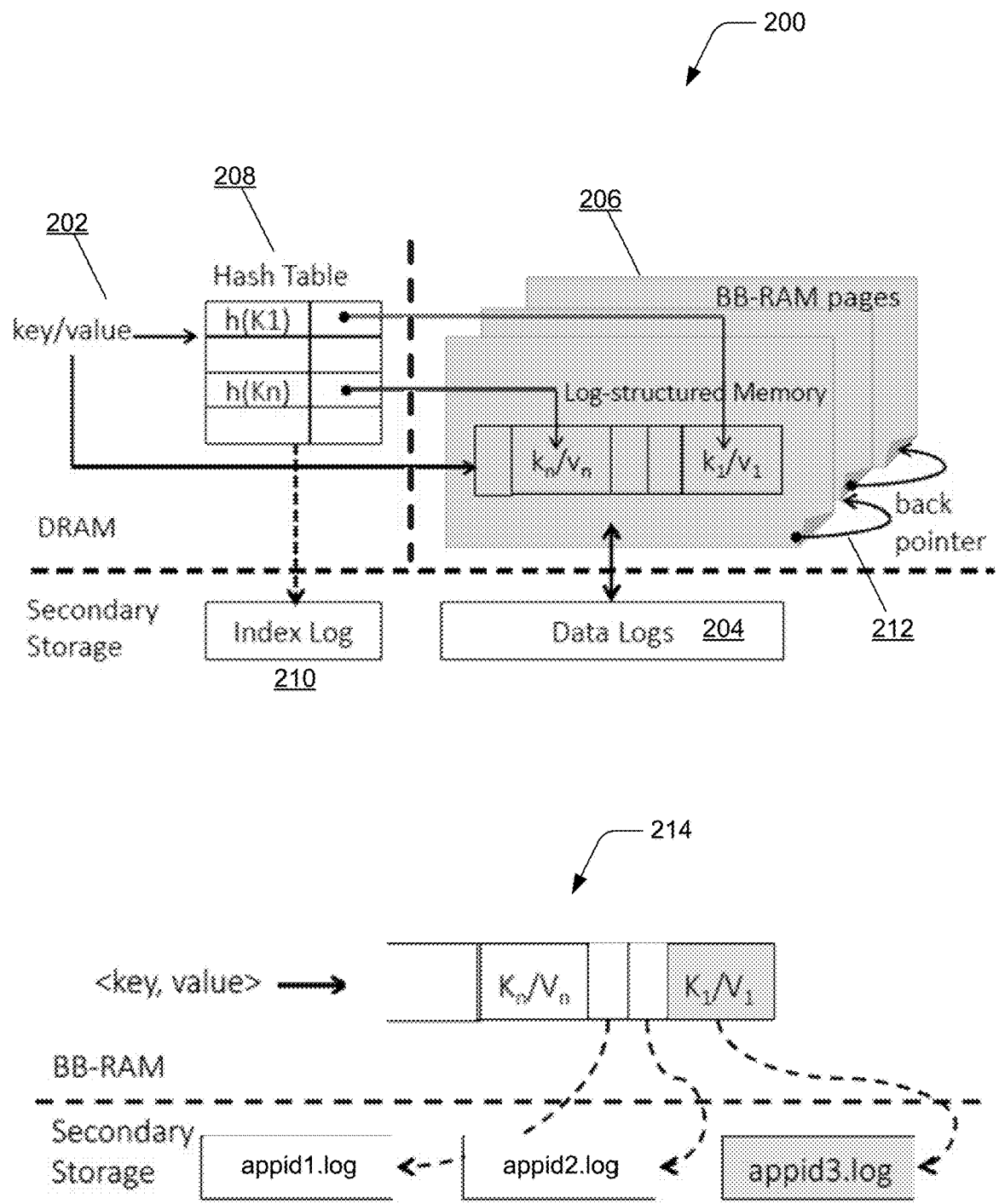
FIG. 2 illustrates an example of a key-value store design in embodiments of battery-backed RAM for wearable devices.

FIG. 2 illustrates an example 200 of a key-value (KV) store design in accordance with embodiments of battery-backed RAM for wearable devices. In this example 200, a KV-store is optimized for battery-backed RAM, which facilitates fast and durable operations for the wearcache 124 (implemented in the wearable device 102) and the wearKV 148 (implemented in the mobile device 104) when inserting new data. The KV-store prioritizes the latest data generated for the wearable device 102 by mobile device applications and by device sensors. Examples include a user's interest in latest notifications and the most recent sensor values that can provide statistics about a run or a workout session, such as for a wearable exercise tracking device.

The KV-store is implemented as a sequential log of key-value pairs in battery-backed RAM with first-in, first-out (FIFO) replacement. FIG. 2 illustrates the design with keys and values that are arbitrary length data blobs. New values are inserted by appending the KV-pair 202 to the head of the data log 204 and adding a hash table entry with pointers to the key and the value in the log. The KV-store stores the data in battery-backed RAM 206 and metadata in DRAM. The log of KV-pairs is stored in the battery-backed RAM and the hash table 208 is stored in regular DRAM so that the hash table can be recovered from the battery-backed RAM in the event of a system crash by scanning through the battery-backed RAM pages in a designated order. In the event of a clean shutdown, the hash table 208 is serialized to secondary storage (e.g., the index log 210), which makes effective use of the very limited battery-backed RAM space that is backed by the device battery.

The KV-store can recover the battery-backed RAM 206 and DRAM state after a system crash because the firmware flushes the battery-backed RAM pages to the local flash memory in the event of a system crash. To recover the hash table 208 and the correct head of the log of KV-pairs, the battery-backed RAM pages are ordered in the log, and determined by a four-byte pointer 212 (e.g., back pointer) stored at the tail of every battery-backed RAM page to the next battery-backed RAM page in the log. Each KV-pair in the battery-backed RAM 206 is a sequence of five fields: four bytes indicating the length of the key followed by the key, eight bytes of application identifier (described later), and then four bytes indicating the length of the value followed by the value. This FIFO of battery-backed RAM pages allows the KV-store to arbitrarily increase its size by appending new pages and decrease the size of the log by purging the KV-pairs at the tail to secondary storage. Moreover, the firmware remains simple, the limited battery-backed RAM space is best utilized, and recent data that is of interest for applications is prioritized during page replacement.

The wearcache 124 is the KV-store instance that is implemented in the wearable device 102, and caches all the latest data from applications and sensors. New data arrives in the wearcache 124 via two methods: when mobile device applications push data to their companion applications and when sensors generate new values. When the wearcache 124 runs out of battery-backed RAM, it flushes old data to the wearKV 148 on the mobile device 104 in FIFO order because the focus of the wearable is on the new data. It does so by simply moving the tail forward in the log of KV-pairs on the battery-backed RAM several KV-pairs at a time. This provides the functionalities of having recent data on the wearable device, adapting to memory pressure, and providing an efficient replacement policy. For example, an application on a smartwatch that can leverage this storage model is a notification center for recent emails. The focus will remain on the most recent emails while the older emails may be safely flushed to the wearKV 148, as the user may not access them on the wearable device 102. Complex functionalities are implemented by the email application on the mobile device 104 (e.g., a mobile phone) while a companion email application on the wearable device 102 keeps the design and user interface simple with focus on the latest data.

The wearcache 124 removes the flash I/O overhead from the critical path of device applications. The operating system, application binaries, and other application metadata continue to reside on the local flash. However, data accessed in the critical path resides in the weardrive, and the key-value interface to the weardrive eases development as wearable applications already use the key-value interface for sharing data between the mobile device 104 and the wearable device 102.

The weardrive (i.e., the wearable device data manager 122 and the mobile device data manager 146) supports simple sensor data analytics on the wearable device 102 and complex data analytics on the mobile device 104. A smaller-sized battery can restrict the wearable device 102 to analyzing sensor logs from short activities, such as the latest run, workout-session, or other short activity. However, applications can perform rigorous analytics on the mobile device 104 (e.g., a mobile phone), even several days' worth of sensor logs at a time. The applications on the mobile device 104 can proactively pull the sensor data from the wearcache 124 when a certain number of samples are available. For example, a fitness tracker on the mobile device 104 can register with the wearcache 124 that the heart-rate logs from the wearable device 102 be pushed to the mobile device 104 once every ten minutes, and the wearcache 124 implements these requests. For each sensor, the wearcache 124 pre-allocates a KV-pair, and a certain amount of space is reserved for the value upfront. The sensor samples (configurable sampling rate) are gradually added to the pre-allocated value as they become available, and the data is pushed to the mobile device 104 where device applications are notified accordingly.

The battery-backed RAM 206 performs better than flash memory for sensor sampling because sensor values need to be stored durably so as to avoid losing them, which would lead to incorrect analytics and can significantly reduce the usefulness of health applications. Using flash memory to ensure the durability for data that trickles in at a few bytes a second would drastically slow down the performance. However, the battery-backed RAM is a low-latency, non-volatile medium that provides fast and durable sensor logging, and the wearKV 148 is the KV-store instance that is implemented in the mobile device 104 and contains all of the wearable device 102 data, to include extended display data and the entire log of sensor values. The extended display data can be fetched back to the wearcache 124 on-demand, and the mobile device 104 with the larger battery can use the full sensor log to perform rigorous sensor data analysis. When the wearKV 148 runs out of battery-backed RAM, it flushes the old data to flash memory 138 where it creates a per-application and per-sensor sequential log as shown at 214, which is accomplished by leveraging the metadata information stored in the values where it records the device-ID, application-ID, sensor-ID, and time stamp of creation.

Data managed by the weardrive crosses the memory-flash boundary only on the mobile device 104, and data encryption and other mechanisms put in place for security and privacy of the data are needed only for the non-volatile media like the flash memory that can be detached from the rest of the device with the possibility of unprotected data being stolen. Therefore, the power-intensive software cost of data storage is offloaded to the mobile device 104, and utilizing DRAM as non-volatile by using it as battery-backed RAM is at least as secure as the previous model having data that is encrypted in DRAM. The battery-backed RAM provides a mechanism to secure the data in DRAM, as opposed to making DRAM truly non-volatile.

Offline, the wearcache 124 of the wearable device 102 can function without the mobile device 104, and the wearcache 124 can lock data on the wearable device 102 based on a time of arrival, such that it is not flushed to the mobile device 104 until explicitly deleted. Offline capabilities allow applications to lock data so that it is available locally, and so that functionality can be provided without the mobile device 104. An example is when the email companion application imposes a restriction that email from last three days be locked locally. The KV-pairs are written to flash memory 114 on the wearable device 102 only if the wearcache 124 runs out of battery-backed RAM and the applications impose an offline availability restriction. The offline requirements are specified in the wearcache 124 using time cutoffs per applications and per sensor. The specified time is compared with the timestamp stored in the metadata of a KV-pair. The qualified offline data is written to the local flash logs, and as time passes, the wearcache 124 will move the tail closer to the head on the flash log and overwrite older data that the application no longer needs.

In implementations, the weardrive includes the KV-store, a data transfer library, and code to implement embodiments of battery-backed RAM for wearable devices. The weardrive can be accessed via application program interface (API) calls on all of the devices, as described below. The InsertKV and ReadKV function calls append the application ID (stored in handle) to the key for inserting and reading the data, which isolates the data between applications. Privacy is protected by not providing user-space access to the battery-backed RAM, but rather all of the data is accessed through user space buffers provided to the system calls. Sensor values are aggregated by the weardrive on a per-sensor basis, and the applications can register for sensor logs for each sensor. The weardrive samples the sensors and directly appends the data to the pre-allocated KV-pair that is buffering the current set of sensor samples. When enough samples are available, the weardrive can notify the applications that registered for that particular sensor log.

In implementations, the API calls for weardrive include:
OpenWearDrive (FileName) to open a connection to weardrive and obtain a handle, the data is represented using an opaque FileName.
CloseWearDrive (handle) to close the connection to weardrive and flush any data from battery-backed RAM in the process to an appropriate location.
InsertKV (handle, key, value) to insert the new key-value pair to the FileName corresponding to the handle.
ReadKV (handle, key) to provide the value corresponding to the key in the FileName file.
MakeOffline (handle, date) to make all data of this file that arrived after a certain date available on the wearable device even when the mobile device is not reachable. Date is specified relative to the current time, and this function is available only to wearcache.
DeleteOldData (handle, date) to provide a hint to weardrive that data beyond a certain date can be deleted. Date is an absolute value, and this function is available only to wearKV.
RegisterForSensor (DeviceID, SensorID) to register an application for values from the sensor represented by (DeviceID, SensorID).
UnregisterFromSensor (DeviceID, SensorID) to unregister the application from a sensor.
RegisterCallBack (TimeGap, CallBackFunction) to make weardrive issue the CallBackFunction in the context of registering an application every TimeGap seconds with the newly available sensor values.
Compute (DeviceID1, SensorID1, DeviceIDN, SensorIDN, TimeGap) as a function that does not access any global variables, but accesses data in sensor logs that are accessible to the application, and it can be executed on both the wearable device and the mobile device (e.g., a mobile phone).

Example methods 300 and 400 are described with reference to respective FIGS. 3 and 4 in accordance with one or more embodiments of battery-backed RAM for wearable devices 102. Generally, any of the components, modules, methods, and operations described herein can be implemented using software, firmware, hardware (e.g., fixed logic circuitry), manual processing, or any combination thereof. Some operations of the example methods may be described in the general context of executable instructions stored on computer-readable storage memory that is local and/or remote to a computer processing system, and implementations can include software applications, programs, functions, and the like. Alternatively or in addition, any of the functionality described herein can be performed, at least in part, by one or more hardware logic components, such as, and without limitation, Field-programmable Gate Arrays (FPGAs), Application-specific Integrated Circuits (ASICs), Application-specific Standard Products (ASSPs), System-on-a-chip systems (SoCs), Complex Programmable Logic Devices (CPLDs), and the like.

Figure 3:
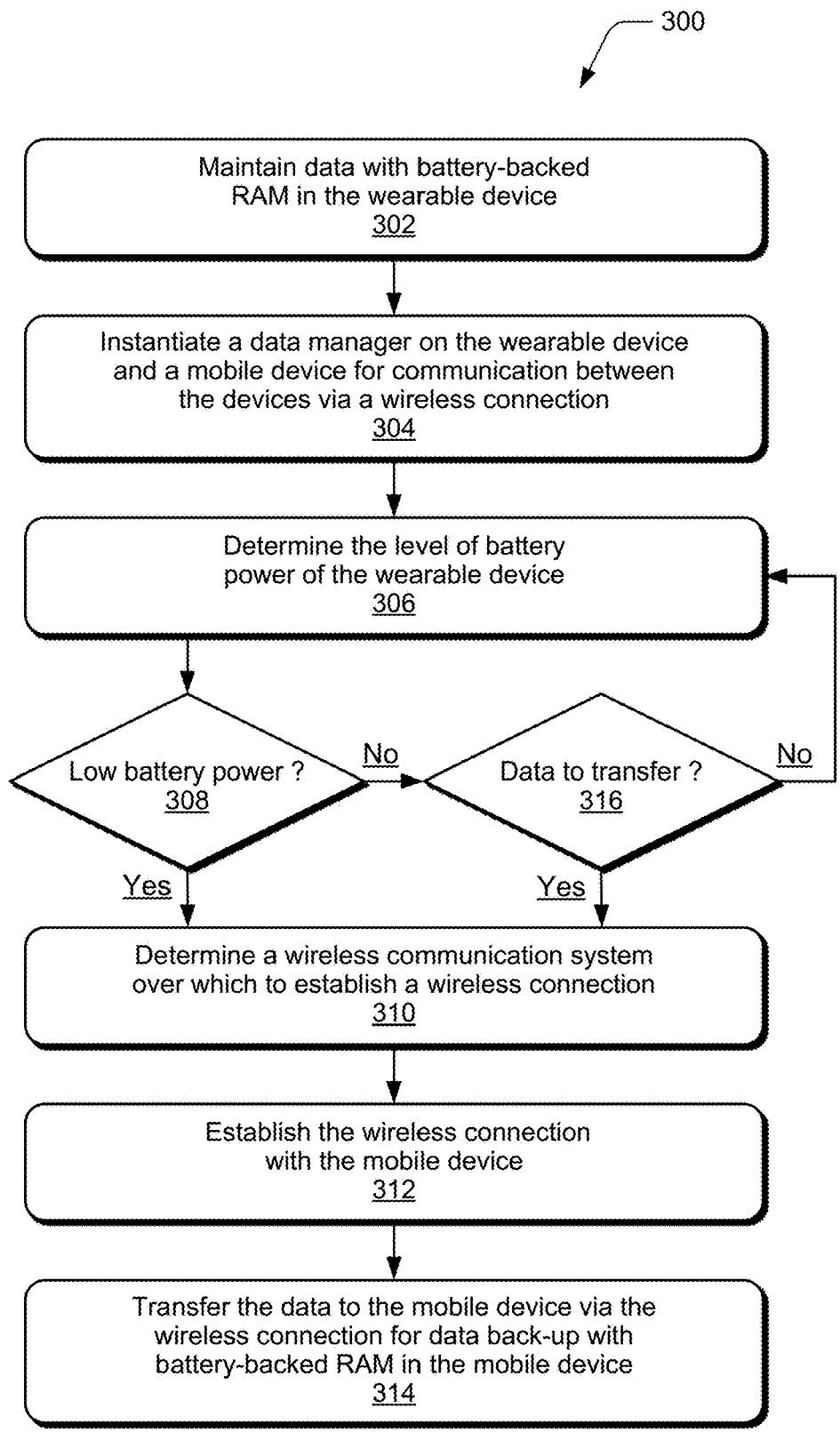
FIG. 3 illustrates example method(s) of battery-backed RAM for wearable devices in accordance with one or more embodiments.

FIG. 3 illustrates example method(s) 300 of battery-backed RAM for wearable devices 102, and is generally described with reference to backing-up data from battery-backed random access memory (RAM) 112 in a wearable device 102 to a mobile device 104. The order in which the method is described is not intended to be construed as a limitation, and any number or combination of the method operations can be performed in any order to implement a method, or an alternate method.

At 302, data 116 is maintained with battery-backed RAM 112 in the wearable device 102. For example, the wearable device 102 is implemented with the battery-backed RAM 112 that maintains the wearable device data 116 while power is applied by the power source 110 (e.g., a battery) to maintain the data. The wearable device data 116 is maintained in a storage format, such as in a database, file system, as key-value pairs, in block stores, and the like. An index of the data in the storage format, such as key-value pairs, is generated in the wearcache 124, and the index identifies regions of the battery-backed RAM 112 to recover a state of the battery-backed RAM after a device crash or loss of power.

At 304, a data manager is instantiated on the wearable device 102 and a mobile device 104 for communication between the devices via a wireless connection. For example, the data manager 122 is instantiated as a runtime program on the wearable device 102, or is implemented as a component of the device operating system 120 or the storage system. Further, the data manager 146 is instantiated as a runtime program on the mobile device 104, or is implemented as a component of the device operating system 144 or the storage system. The respective data managers communicate between the devices via the wireless connection 128 to facilitate backing-up the wearable device data 116 from the wearable device 102 to the mobile device 104.

At 306, the level of battery power of the wearable device 102 is determined. For example, the data manager 122 that is implemented by the wearable device 102 determines the level of battery power for the wearable device 102 (e.g., a battery implemented as the power source 110). At 308, a determination is made as to whether the wearable device 102 has low battery power. For example, the data manager 122 that is implemented by the wearable device 102 determines (e.g., based on inputs and a power level threshold) whether the wearable device 102 has low battery power. This is a data transfer condition causing the data manager 122 of the wearable device 102 to initiate transferring the wearable device data 116 to the mobile device 104 to back-up the data.

If the wearable device 102 has low battery power (i.e., "Yes" from 308), then at 310, a wireless communication system over which to establish a wireless connection is determined and, at 312, the wireless connection is established with the mobile device 104. For example, the data manager 122 that is implemented by the wearable device 102 determines which of the wireless systems 126 to use to establish the wireless connection 128 with the mobile device 104, and the wireless connection is established by the wireless systems 126 and 150 of the respective devices. The wireless communication system to use for the data transfer can be determined based on the battery power that will be utilized by the wireless communication system to transfer the wearable device data 116 to the mobile device 104. Further, the battery power that will be utilized to transfer the wearable device data 116 can be estimated using the wireless communication system over which the wireless connection is established or a different wireless communication system.

At 314, the data is transferred to the mobile device 104 via the wireless connection for data back-up with battery-backed RAM 136 in the mobile device 104. For example, the data manager 122 that is implemented by the wearable device 102 initiates transferring the wearable device data 116 to the mobile device 104 via the wireless connection 128 for data back-up (e.g., as the back-up data 140) with the battery-backed RAM 136 in the mobile device 104.

If the wearable device 102 does not have low battery power (i.e., "No" from 308), then at 316, a determination is made as to whether at least a quantity threshold of the data is maintained by the battery-backed RAM in the wearable device 102. For example, the data manager 122 that is implemented by the wearable device 102 determines the quantity of data that is being maintained by the battery-backed RAM 112 in the wearable device 102. Having at least a quantity threshold of the data (e.g., at least a minimum amount of data) is a transfer condition causing the data manager 122 of the wearable device 102 to initiate transferring the wearable device data 116 to the mobile device 104 to back-up the data.

If there is not at least a quantity threshold of the data to transfer (i.e., "No" from 316), then the method continues at 306 to determine the level of battery power of the wearable device 102. If there is at least a quantity threshold of the data to transfer (i.e., "Yes" from 316), then the method continues at 310 to determine a wireless communication system over which to establish the wireless connection, at 312 to establish the wireless connection with the mobile device 104, and at 314 to transfer the data to the mobile device 104 via the wireless connection for data back-up. The wearable device data 116 is transferred to the mobile device 104 based on having at least the quantity threshold of the wearable device data 116 and enough battery power to facilitate the transfer of the data.

Figure 4:
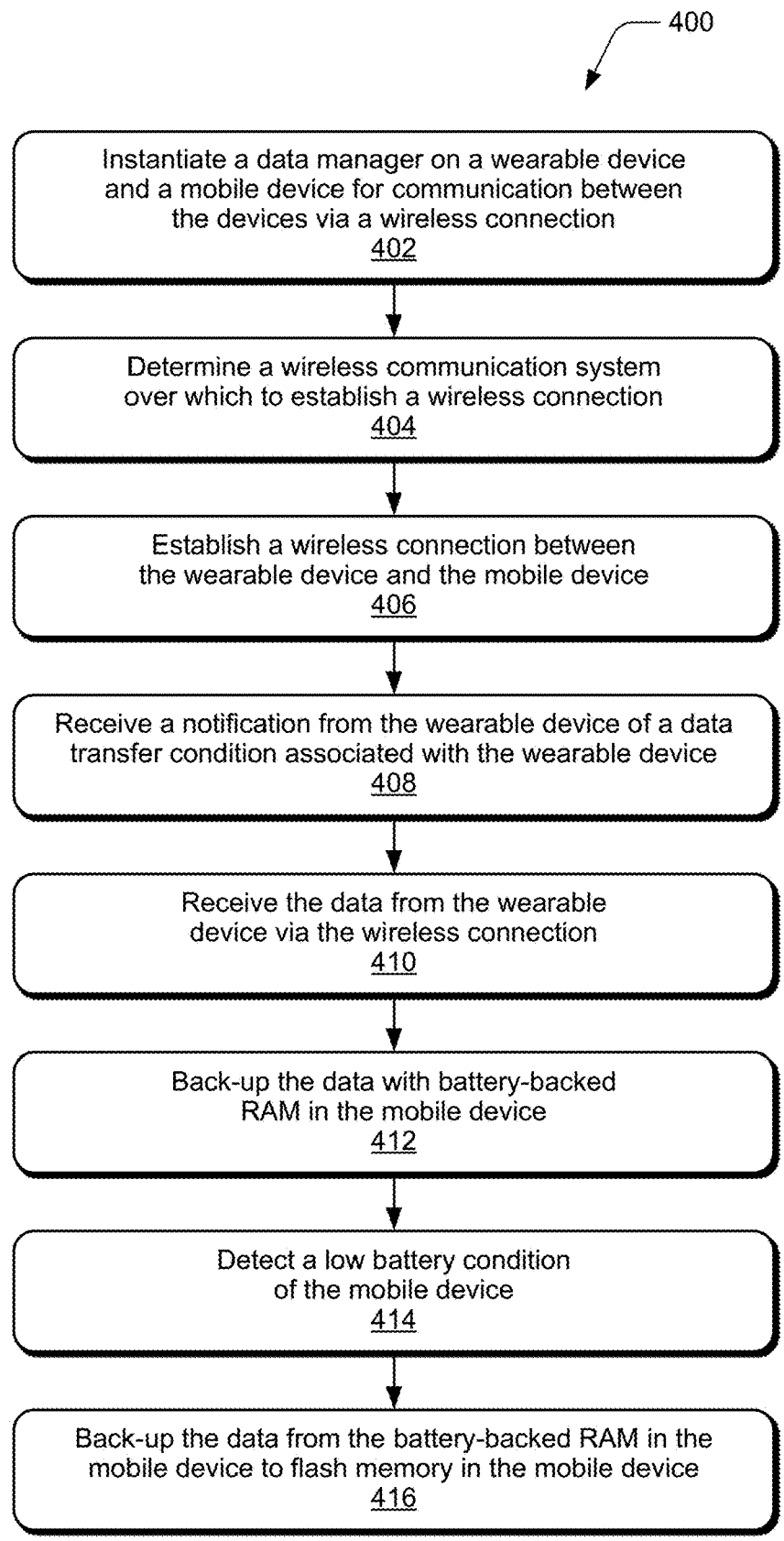
FIG. 4 illustrates example method(s) of battery-backed RAM for wearable devices in accordance with one or more embodiments.

FIG. 4 illustrates example method(s) 400 of battery-backed RAM for wearable devices 102, and is generally described with reference to backing-up data that is received from battery-backed random access memory (RAM) in a wearable device 102. The order in which the method is described is not intended to be construed as a limitation, and any number or combination of the method operations can be performed in any order to implement a method, or an alternate method.

At 402, a data manager is instantiated on a wearable device 102 and a mobile device 104 for communication between the devices via a wireless connection. For example, the data manager 122 is instantiated as a runtime program on the wearable device 102, or is implemented as a component of the device operating system 120 or the storage system. Further, the data manager 146 is instantiated as a runtime program on the mobile device 104, or is implemented as a component of the device operating system 144 or the storage system. The respective data managers communicate between the devices via a wireless connection 128 to facilitate backing-up the wearable device data 116 from the wearable device 102 to the mobile device 104.

At 404, a wireless communication system is determined over which a wireless connection will be established. For example, the data managers of the respective devices (i.e., the wearable device data manager 122 and the mobile device data manager 146) determine which of the wireless systems 150 to use to establish the wireless connection 128 with the wearable device 102. The wireless communication system to use can be determined based on battery power that will be utilized by the wireless communication system to transfer the wearable device data 116 to the mobile device. Further, the battery power that will be utilized to transfer the wearable device data 116 can be estimated using the wireless communication system over which the wireless connection is established or a different wireless communication system.

At 406, a wireless connection is established between the wearable device 102 and the mobile device 104. For example, the wireless connection 128 is established by the wireless systems 126 and 150 of the respective devices. At 408, a notification is received from the wearable device 102 of a data transfer condition associated with the wearable device 102. For example, the data manager 146 that is implemented by the mobile device 104 receives a notification from the data manager 122 of the wearable device 102 of a data transfer condition associated with the wearable device 102, such as an indication of low battery power of the wearable device 102 and/or at least a quantity threshold of the data ready for back-up to the mobile device 104.

At 410, the data is received from the wearable device 102 via the wireless connection and, at 412, the data is backed-up with battery-backed RAM 136 in the mobile device 104. For example, the mobile device 104 receives the wearable device data 116 from the wearable device 102 via the wireless connection 128 and the data is backed-up (e.g., as the back-up data 140) with the battery-backed RAM 136 in the mobile device 104. In implementations, the data is maintained in a storage format, such as in a database, in a file system, as key-value pairs, in block stores, and the like. An index is generated in the wearKV 148 of the data in the storage format, such as key-value pairs, and the index identifies regions of the battery-backed RAM to recover a state of the battery-backed RAM after a device crash or loss of power.

At 414, a low battery condition of the mobile device 104 is detected and, at 416, the data is backed-up from the battery-backed RAM 136 in the mobile device 104 to flash memory 138 in the mobile device 104. For example, the data manager 146 that is implemented by the mobile device 104 detects a low level of battery power for the mobile device 104 (e.g., a battery implemented as the power source 134), and the data manager 146 initiates a further back-up of the data (e.g., the back-up data 140) from the battery-backed RAM 136 in the mobile device 104 to the flash memory 138 in the mobile device.

Figure 5:
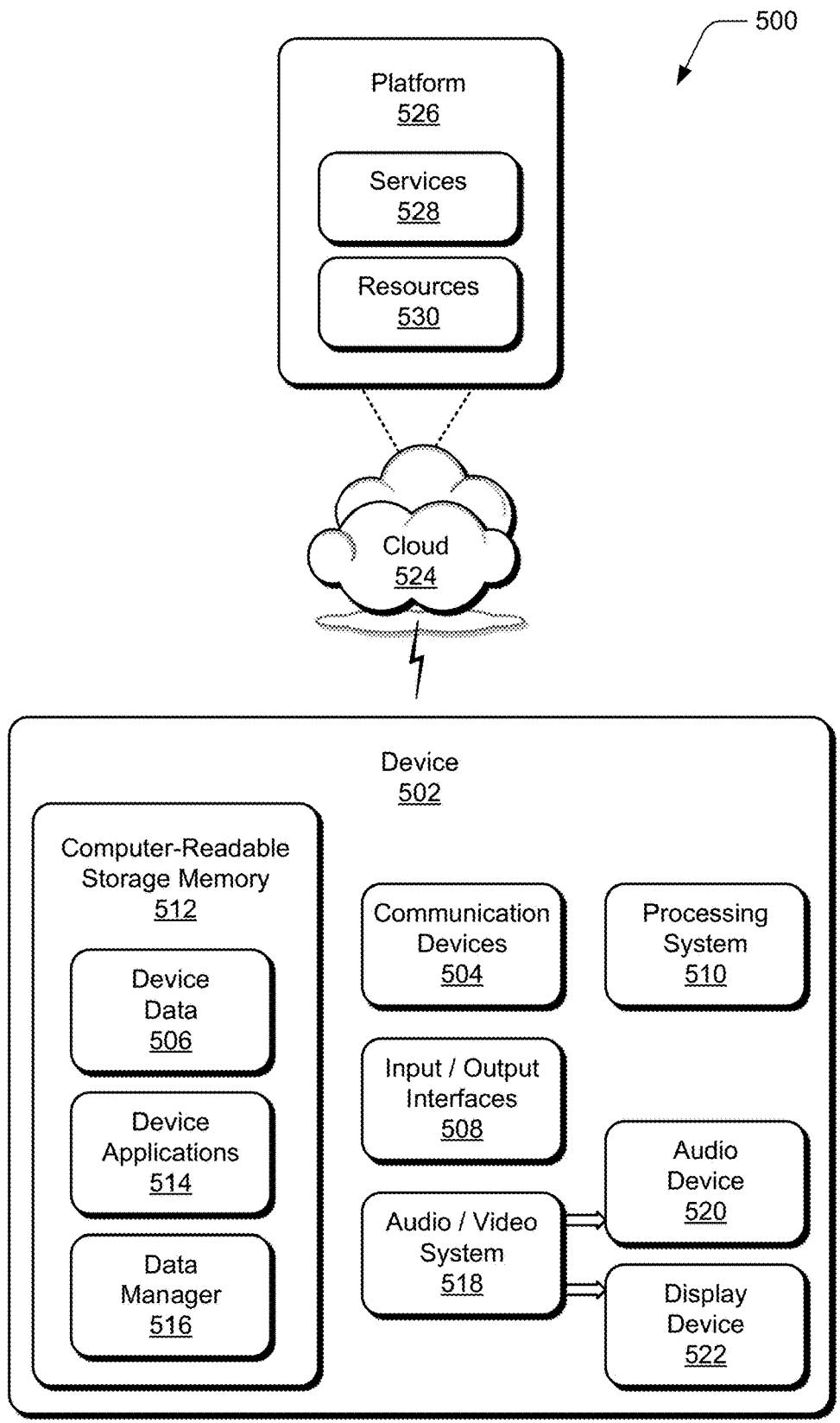
FIG. 5 illustrates an example system with an example device that can implement embodiments of battery-backed RAM for wearable devices.

FIG. 5 illustrates an example system 500 that includes an example device 502, which can implement embodiments of battery-backed RAM for wearable devices. The example device 502 can be implemented as any of the computing devices described with reference to the previous FIGS. 1-4, such as any type of mobile device, wearable device, client device, mobile phone, tablet, computing, communication, entertainment, gaming, media playback, and/or other type of device. For example, the wearable device 102 and the mobile device 104 shown in FIG. 1 may be implemented as the example device 502 or with various components of the example device.

The device 502 includes communication devices 504 that enable wired and/or wireless communication of device data 506, such as the wearable device data and/or any other device or application data. Additionally, the device data can include any type of audio, video, and/or image data. The communication devices 504 can also include transceivers for cellular phone communication and for network data communication.

The device 502 also includes input/output (I/O) interfaces 508, such as data network interfaces that provide connection and/or communication links between the device, data networks, and other devices. The I/O interfaces can be used to couple the device to any type of components, peripherals, and/or accessory devices. The I/O interfaces also include data input ports via which any type of data, media content, and/or inputs can be received, such as user inputs to the device, as well as any type of audio, video, and/or image data received from any content and/or data source.

The device 502 includes a processing system 510 that may be implemented at least partially in hardware, such as with any type of microprocessors, controllers, and the like that process executable instructions. The processing system can include components of an integrated circuit, programmable logic device, a logic device formed using one or more semiconductors, and other implementations in silicon and/or hardware, such as a processor and memory system implemented as a system-on-chip (SoC). Alternatively or in addition, the device can be implemented with any one or combination of software, hardware, firmware, or fixed logic circuitry that may be implemented with processing and control circuits. The device 502 may further include any type of a system bus or other data and command transfer system that couples the various components within the device. A system bus can include any one or combination of different bus structures and architectures, as well as control and data lines.

The device 502 also includes a computer-readable storage memory 512, such as data storage devices that can be accessed by a computing device, and that provide persistent storage of data and executable instructions (e.g., software applications, programs, functions, and the like). Examples of the computer-readable storage memory 512 include volatile memory and non-volatile memory, fixed and removable media devices, and any suitable memory device or electronic data storage that maintains data for computing device access. The computer-readable storage memory can include various implementations of random access memory (RAM) (e.g., the DRAM and battery-backed RAM), read-only memory (ROM), flash memory, and other types of storage media in various memory device configurations.

The computer-readable storage memory 512 provides storage of the device data 506 and various device applications 514, such as an operating system that is maintained as a software application with the computer-readable storage memory and executed by the processing system 510. In this example, the device applications include a data manager that implements embodiments of battery-backed RAM for wearable devices, such as when the example device 502 is implemented as the wearable device 102 and/or the mobile device 104 shown in FIG. 1. Examples of the data manager 516 include the wearable device data manager 122 and the mobile device data manager 146, as described with reference to FIGS. 1-4.

The device 502 also includes an audio and/or video system 518 that generates audio data for an audio device 520 and/or generates display data for a display device 522. The audio device and/or the display device include any devices that process, display, and/or otherwise render audio, video, display, and/or image data. In implementations, the audio device and/or the display device are integrated components of the example device 502. Alternatively, the audio device and/or the display device are external, peripheral components to the example device.

In embodiments, at least part of the techniques described for battery-backed RAM for wearable devices may be implemented in a distributed system, such as over a "cloud" 524 in a platform 526. The cloud 524 includes and/or is representative of the platform 526 for services 528 and/or resources 530. The platform 526 abstracts underlying functionality of hardware, such as server devices (e.g., included in the services 528) and/or software resources (e.g., included as the resources 530), and connects the example device 502 with other devices, servers, etc. The resources 530 may also include applications and/or data that can be utilized while computer processing is executed on servers that are remote from the example device 502. Additionally, the services 528 and/or the resources 530 may facilitate subscriber network services, such as over the Internet, a cellular network, or Wi-Fi network. The platform 526 may also serve to abstract and scale resources to service a demand for the resources 530 that are implemented via the platform, such as in an interconnected device embodiment with functionality distributed throughout the system 500. For example, the functionality may be implemented in part at the example device 502 as well as via the platform 526 that abstracts the functionality of the cloud.

Although embodiments of battery-backed RAM for wearable devices have been described in language specific to features and/or methods, the appended claims are not necessarily limited to the specific features or methods described. Rather, the specific features and methods are disclosed as example implementations of battery-backed RAM for wearable devices, and other equivalent features and methods are intended to be within the scope of the appended claims. Further, various different embodiments are described and it is to be appreciated that each described embodiment can be implemented independently or in connection with one or more other described embodiments. Additional aspects of the techniques, features, and/or methods discussed herein relate to one or more of the following embodiments.

A system implemented to back-up data from battery-backed random access memory (RAM) in a wearable device to a mobile device comprises a wearable device configured to maintain the data with the battery-backed RAM in the wearable device; a wireless connection established for wireless data communication between the wearable device and a mobile device that is configured to back-up the data when received from the wearable device; and a memory and processor system to implement a data manager that is configured to detect a low battery condition of the wearable device, and initiate transfer of the data to the mobile device via the wireless connection.

Alternatively or in addition to the above described system, any one or combination of: the data manager is configured to detect at least a quantity threshold of the data maintained with the battery-backed RAM in the wearable device, determine battery power of the wearable device, and initiate the transfer of the data to the mobile device based on having at least the quantity threshold of the data and the battery power to facilitate the transfer of the data; the mobile device is configured to back-up the data to battery-backed RAM in the mobile device when received from the wearable device, and detect a low battery condition of the mobile device and back-up the data from the battery-backed RAM in the mobile device to flash memory in the mobile device; the data manager is configured to determine a wireless communication system over which the wireless connection is established, the wireless communication system determined based on battery power that will be utilized by the wireless communication system to transfer the data to the mobile device; the data manager is configured to determine the wireless communication system based on an estimate of the battery power that will be utilized to transfer the data, the estimate determined using the wireless communication system over which the wireless connection is established, or a different wireless communication system over which the wireless communication is established; the data manager is instantiated on both the wearable device and the mobile device, and the wearable device data manager is configured to communicate with the mobile device data manager via the wireless connection; and the data is maintained in a storage format, and the data manager is configured to generate an index of the data in the storage format, the index configured to identify regions of the battery-backed RAM and the index maintained to recover a state of the battery-backed RAM.

A method implemented to back-up data from battery-backed random access memory (RAM) in a wearable device to a mobile device comprises maintaining the data with the battery-backed RAM in the wearable device; detecting a data transfer condition associated with the wearable device; establishing a wireless connection with the mobile device; and transferring the data to the mobile device via the wireless connection for data back-up with battery-backed RAM in the mobile device.

Alternatively or in addition to the above described method, any one or combination of: determining battery power of the wearable device, and the data transfer condition is detected as low battery power of the wearable device; determining battery power of the wearable device, the data transfer condition is detected as at least a quantity threshold of the data maintained by the battery-backed RAM in the wearable device, and transferring the data to the mobile device based on having at least the quantity threshold of the data and the battery power to facilitate the transfer of the data; determining a wireless communication system over which the wireless connection is established, the wireless communication system determined based on battery power that will be utilized by the wireless communication system to transfer the data to the mobile device; estimating the battery power that will be utilized to transfer the data using the wireless communication system over which the wireless connection is established, or a different wireless communication system than the wireless communication system over which the wireless connection is established; instantiating a data manager on both the wearable device and the mobile device for communication between the devices via the wireless connection to back-up the data from the wearable device to the mobile device; and the data is maintained in a storage format, and generating an index of the data in the storage format that identifies regions of the battery-backed RAM to recover a state of the battery-backed RAM.

A method implemented to back-up data that is received from battery-backed random access memory (RAM) in a wearable device comprises establishing a wireless connection between the wearable device and a mobile device; receiving a notification from the wearable device of a data transfer condition associated with the wearable device; receiving the data from the wearable device via the wireless connection; and backing-up the data with battery-backed RAM in the mobile device.

Alternatively or in addition to the above described method, any one or combination of: the notification of the data transfer condition is at least one of low battery power of the wearable device, and at least a quantity threshold of the data ready for back-up at the mobile device; detecting a low battery condition of the mobile device, and backing-up the data from the battery-backed RAM in the mobile device to flash memory in the mobile device; determining a wireless communication system over which the wireless connection is established, the wireless communication system determined based on battery power that will be utilized by the wireless communication system to transfer the data from the wearable device; estimating the battery power that will be utilized to transfer the data using the wireless communication system over which the wireless connection is established, or a different wireless communication system than the wireless communication system over which the wireless connection is established; and the data is maintained in a storage format, and generating an index of the data in the storage format that identifies regions of the battery-backed RAM to recover a state of the battery-backed RAM.

The invention claimed is:

1. An apparatus comprising:
   at least one processor;
   a wireless interface for establishing a wireless connection with a client device;
   memory in electronic communication with the at least one processor; and
   instructions stored in the memory, the instructions being executable by the at least one processor to:
      maintain data within a battery-backed random-access memory (RAM) of the apparatus;
      identify a condition of the apparatus associated with triggering a backup of data from the battery-backed RAM of the apparatus; and
      in response to identifying the condition of the apparatus associated with triggering the backup of data:
         identify a subset of data for backup from the data maintained within the battery-backed RAM of the apparatus; and
         initiate a transfer of the subset of data from the battery-backed RAM of the apparatus to the client device via the wireless connection.

2. The apparatus of claim 1, further comprising instructions being executable to:
   differentiate between a first region of data and a second region of data within the battery-backed RAM of the apparatus; and
   wherein identifying the subset of data for backup comprises identifying the first region of data.

3. The apparatus of claim 2, wherein initiating the transfer of the subset of data comprises providing the first region of data without providing data from the second region of data.

4. The apparatus of claim 2, wherein:
   the first region of data refers to more recently generated data by one or more sensors on the apparatus that has not been previously backed up; and
   the second region of data refers to less recently generated data by the one or more sensors on the apparatus that has previously been backed up to a non-volatile memory.

5. The apparatus of claim 2, further comprising instructions being executable to:
   associate data collected by the apparatus and maintained within the battery-backed RAM with corresponding key values; and
   wherein differentiating between the first region of data and the second region of data is based on the corresponding key values.

6. The apparatus of claim 5, wherein initiating transfer of the data comprises initiating a transfer of the data and associated key values for maintaining a state of the data upon recovery of the data from a backup storage space.

7. The apparatus of claim 1, wherein identifying the condition of the apparatus that triggers the backup of data comprises:

detecting a warning for a warm shutdown of the apparatus, the warning for the warm shutdown comprising a signal indicating that the apparatus is about to restart; and detecting a low-power condition of a battery powering the battery-backed RAM of the apparatus.

8. The apparatus of claim 1, wherein identifying the condition of the apparatus that triggers the backup of data comprises detecting a warning for a cold shutdown of the apparatus, the warning for the cold shutdown comprising a signal indicating that the apparatus is about to turn off.

9. The apparatus of claim 1, further comprising instructions being executable to:

identify a power level of a battery of the apparatus;

based on the identified power level of the battery, identify an additional wireless connection for transferring the subset of data from the battery-backed RAM of the apparatus to the client device; and wherein identifying the subset of data for backup further comprises identifying a region of the data from the battery-backed RAM of the apparatus based on a first type of the wireless connection and a second type of the additional wireless connection.

10. The apparatus of claim 1, wherein:

identifying the condition of the apparatus associated with triggering the backup of data comprises determining that storage space on the battery-backed RAM is full; and identifying the subset of data for backup from the data maintained within the battery-backed RAM of the apparatus comprises identifying a subset of old data corresponding to data generated less recently by the apparatus than additional data from the data maintained within the battery-backed RAM of the apparatus.

11. A computer-implemented method, comprising:

maintaining data within a battery-backed random-access memory (RAM) of an apparatus;

identifying a condition of the apparatus associated with triggering a backup of data from the battery-backed RAM of the apparatus;

establishing, via a wireless interface of the apparatus, a wireless connection with a client device; and in response to identifying the condition of the apparatus associated with triggering the backup of data:

identifying a subset of data for backup from the data maintained within the battery-backed RAM of the apparatus; and initiating a transfer of the subset of data from the battery-backed RAM of the apparatus over the wireless connection with the client device to the client device via the wireless connection.

12. The method of claim 11, further comprising:

differentiating between a first region of data and a second region of data within the battery-backed RAM of the apparatus, wherein identifying the subset of data for backup comprises identifying the first region of data; and wherein initiating the transfer of the subset of data comprises providing the first region of data without providing data from the second region of data.

13. The method of claim 12, further comprising:

associating data collected by the apparatus and maintained within the battery-backed RAM with corresponding key values, wherein differentiating between the first region of data and the second region of data is based on the corresponding key values; and wherein initiating transfer of the data comprises initiating a transfer of the data and associated key values for maintaining a state of the data upon recovery of the data from a backup storage space.

14. The method of claim 11, wherein identifying the condition of the apparatus that triggers the backup of data comprises either:

detecting both a low-power condition of a battery powering the battery-backed RAM of the apparatus and a warning for a warm shutdown of the apparatus, the warning for the warm shutdown comprising a signal indicating that the apparatus is about to restart; or detecting a warning for a cold shutdown of the apparatus, the warning for the cold shutdown comprising a signal indicating that the apparatus is about to turn off.

15. The method of claim 11, wherein:

identifying the condition of the apparatus associated with triggering the backup of data comprises determining that storage space on the battery-backed RAM is full; and identifying the subset of data for backup from the data maintained within the battery-backed RAM of the apparatus comprises identifying a subset of old data corresponding to data generated less recently by the apparatus than additional data from the data maintained within the battery-backed RAM of the apparatus.

16. A non-transitory computer readable medium storing instructions thereon that, when executed by at least one processor, cause a wearable apparatus to:

maintain data within a battery-backed random-access memory (RAM) of the wearable apparatus;

identify a condition of the wearable apparatus associated with triggering a backup of data from the battery-backed RAM of the wearable apparatus;

establish, via a wireless interface of the wearable apparatus, a wireless connection with a client device; and in response to identifying the condition of the wearable apparatus associated with triggering the backup of data:

identify a subset of data for backup from the data maintained within the battery-backed RAM of the wearable apparatus; and initiate a transfer of the subset of data from the battery-backed RAM of the wearable apparatus over the wireless connection with the client device to the client device via the wireless connection.

17. The non-transitory computer readable medium of claim 16, further comprising instructions that, when executed by the at least one processor, cause the wearable apparatus to:

differentiate between a first region of data and a second region of data within the battery-backed RAM of the wearable apparatus, wherein identifying the subset of data for backup comprises identifying the first region of data; and wherein initiating the transfer of the subset of data comprises providing the first region of data without providing data from the second region of data.

18. The non-transitory computer readable medium of claim 17, further comprising instructions that, when executed by the at least one processor, cause the wearable apparatus to:

associate data collected by the wearable apparatus and maintained within the battery-backed RAM with corresponding key values, wherein differentiating between the first region of data and the second region of data is based on the corresponding key values; and wherein initiating transfer of the data comprises initiating a transfer of the data and associated key values for maintaining a state of the data upon recovery of the data from a backup storage space.

19. The non-transitory computer readable medium of claim 16, wherein identifying the condition of the wearable apparatus that triggers the backup of data comprises either:
- detecting both a low-power condition of a battery powering the battery-backed RAM of the wearable apparatus and a warning for a warm shutdown of the wearable apparatus, the warning for the warm shutdown comprising a signal indicating that the wearable apparatus is about to restart; or
- detecting a warning for a cold shutdown of the wearable apparatus, the warning for the cold shutdown comprising a signal indicating that the wearable apparatus is about to turn off.

20. The non-transitory computer readable medium of claim 16, wherein:
- identifying the condition of the wearable apparatus associated with triggering the backup of data comprises determining that storage space on the battery-backed RAM is full; and
- identifying the subset of data for backup from the data maintained within the battery-backed RAM of the wearable apparatus comprises identifying a subset of old data corresponding to data generated less recently by the wearable apparatus than additional data from the data maintained within the battery-backed RAM of the wearable apparatus.

* * * * *